United States Patent
Leobandung

(10) Patent No.: US 10,600,795 B2
(45) Date of Patent: Mar. 24, 2020

(54) INTEGRATION OF FLOATING GATE MEMORY AND LOGIC DEVICE IN REPLACEMENT GATE FLOW

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/882,502

(22) Filed: Jan. 29, 2018

(65) Prior Publication Data
US 2018/0166456 A1    Jun. 14, 2018

Related U.S. Application Data

(63) Continuation of application No. 15/241,759, filed on Aug. 19, 2016, now Pat. No. 9,899,397.

(51) Int. Cl.
| | |
|---|---|
| *H01L 27/115* | (2017.01) |
| *H01L 21/28* | (2006.01) |
| *H01L 29/66* | (2006.01) |
| *H01L 27/11539* | (2017.01) |
| *H01L 29/78* | (2006.01) |

(Continued)

(52) U.S. Cl.
CPC .. *H01L 27/11539* (2013.01); *H01L 27/11536* (2013.01); *H01L 29/40114* (2019.08); *H01L 29/513* (2013.01); *H01L 29/66545* (2013.01); *H01L 29/66825* (2013.01); *H01L 29/785* (2013.01); *H01L 29/7881* (2013.01); *H01L 29/7883* (2013.01); *H01L 27/0886* (2013.01); *H01L 27/1211* (2013.01)

(58) Field of Classification Search
CPC ................................. H01L 27/11539
See application file for complete search history.

(56) References Cited

U.S. PATENT DOCUMENTS

| | | |
|---|---|---|
| 9,276,005 B1 | 3/2016 | Zhou et al. |
| 9,842,845 B1 | 12/2017 | Melde et al. |

(Continued)

OTHER PUBLICATIONS

List of IBM Patents or Patent Applications Treated as Related Dated Jan. 29, 2018, 2 Pages.

*Primary Examiner* — Moazzam Hossain
*Assistant Examiner* — Omar F Mojaddedi
(74) *Attorney, Agent, or Firm* — Scully, Scott, Murphy & Presser, P.C.; L. Jeffrey Kelly, Esq.

(57) ABSTRACT

After forming a first sacrificial gate stack over a portion of a first semiconductor fin located in a logic device region of a substrate, and a second sacrificial gate stack over a portion of a second semiconductor fin located in a memory device region of the substrate, in which each of the first sacrificial gate stack and the second sacrificial gate stack includes, from bottom to top, a tunneling oxide portion, a floating gate electrode, a control oxide portion, a gate conductor and a gate cap, an entirety of the first sacrificial gate stack is removed to provide a first gate cavity, and only the gate cap and the gate conductor are removed from the second sacrificial gate stack to provide a second gate cavity. Next, a high-k gate dielectric and a gate electrode are formed within each of the first gate cavity and the second gate cavity.

16 Claims, 8 Drawing Sheets

(51) Int. Cl.
   *H01L 29/788*   (2006.01)
   *H01L 27/11536*   (2017.01)
   *H01L 29/51*   (2006.01)
   *H01L 27/088*   (2006.01)
   *H01L 27/12*   (2006.01)

(56) References Cited

U.S. PATENT DOCUMENTS

| | | |
|---|---|---|
| 10,014,307 B2 | 7/2018 | Chan et al. |
| 2006/0091450 A1 | 5/2006 | Zhu et al. |
| 2010/0052034 A1* | 3/2010 | Cheng ............... H01L 29/66825 257/316 |
| 2013/0178030 A1 | 7/2013 | Ramkumar et al. |
| 2014/0008713 A1* | 1/2014 | Toh ................... H01L 21/28273 257/321 |
| 2015/0137207 A1* | 5/2015 | Chuang ................... H01L 29/49 257/316 |
| 2017/0365522 A1* | 12/2017 | Jeong .............. H01L 21/823814 |

* cited by examiner

US 10,600,795 B2

INTEGRATION OF FLOATING GATE MEMORY AND LOGIC DEVICE IN REPLACEMENT GATE FLOW

BACKGROUND

The present application relates to semiconductor device fabrication, and more particularly, to integrating non-volatile memory devices and logic devices on the same substrate.

A non-volatile memory device is one that can retain stored information in the absence of power. It is beneficial to integrate non-volatile memory device into logic circuits for high performance CPU, FPGA or neural network. However, the integration of non-volatile memory devices with logic devices has always been a challenge due to the different requirements for the non-volatile memory devices, which store charge, and the logic devices which are commonly intended for high speed operation. The need for storing charge has been addressed mostly with the use of floating gate. The need for this unique floating gate makes integration of the non-volatile memory devices and the logic devices difficult. In addition, since current advanced logic technology is typically accomplished using a replacement gate (also called gate-last) process flow, a method that allows effectively integrating non-volatile memory devices and logic devices in a replacement gate process flow is highly desirable.

SUMMARY

The present application provides a method for integrating non-volatile memory transistors and logic transistors using a gate-last process flow.

According to an aspect of the present application, a semiconductor structure is provided. The semiconductor structure includes a logic transistor located in a logic device region of a substrate and a non-volatile memory transistor located in a memory device region of the substrate. The logic transistor includes a first functional gate stack contacting a first body region of a first semiconductor fin and including a first high-k gate dielectric and a first gate electrode surrounded by the first high-k gate dielectric, and first source/drain regions located within the first semiconductor fin and laterally surrounding the first body region. The non-volatile memory transistor includes a second functional gate stack contacting a second body region of a second semiconductor fin and including a tunnel oxide portion, a floating gate electrode, a control oxide portion, a second high-k gate dielectric and a second gate electrode surrounded by the second high-k gate dielectric, and second source/drain regions located within the second semiconductor fin and laterally surrounding the second body region.

According to another aspect of the present application, a method of forming a semiconductor structure is provided. The method includes forming a first sacrificial gate stack over a first body region of a first semiconductor fin located in a logic device region of a substrate, and a second sacrificial gate stack over a second body region of a second semiconductor fin located in a memory device region of the substrate. The first sacrificial gate stack includes a first tunneling oxide portion, a first floating gate electrode, a first control oxide portion, a first gate conductor and a first gate cap, and the second sacrificial gate stack includes a second tunneling oxide portion, a second floating gate electrode, a second control oxide portion, a second gate conductor and a second gate cap. After forming first gate cavity by removing an entirety of the first sacrificial gate stack and a second gate cavity by removing the second gate cap and the second gate conductor in the second sacrificial gate stack, a first high-k gate dielectric is formed over a bottom surface and sidewalls of the first gate cavity and a first gate electrode is formed filling a remaining volume of the first gate cavity, while a second high-k gate dielectric is formed over a bottom surface and sidewalls of the second gate cavity and a second gate electrode is formed filling a remaining volume of the second gate cavity.

DETAILED DESCRIPTION

Figure 1A:
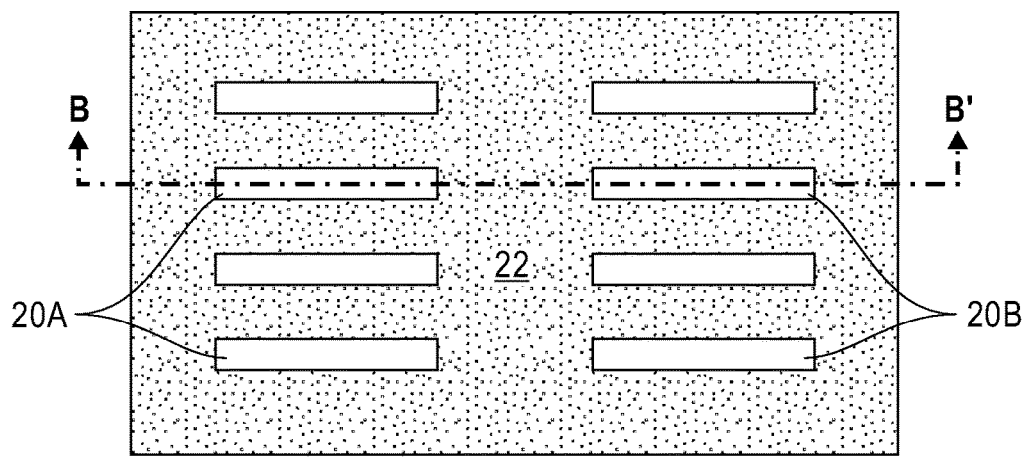
FIG. 1A is a top-down view of an exemplary semiconductor structure including a plurality of first semiconductor fins located in a logic device region of a substrate and a plurality of second semiconductor fins located in a memory device region of the substrate, and a shallow trench isolation (STI) layer formed around lower portions of the first and second semiconductor fins according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It should be noted that although the following description and drawings illustrate the basic processing steps employed to integration of fin-based logic and non-volatile memory transistors, the basic concept of the present application can also be applied to integration of planar- or nanowire-based logic and non-volatile memory transistors.

Figure 1B:
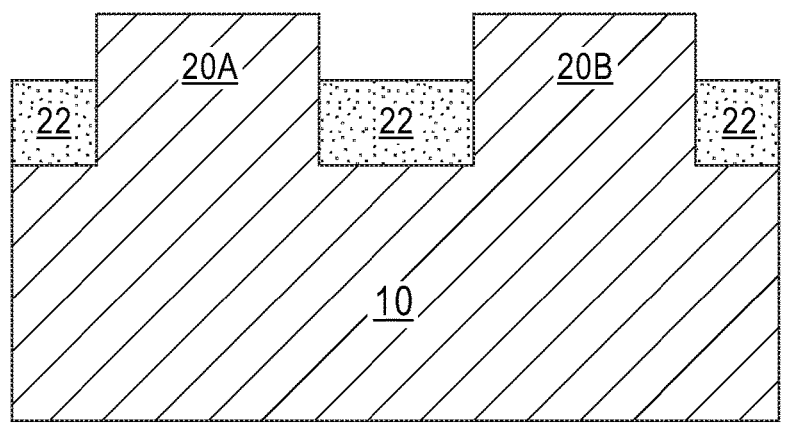
FIG. 1B is a cross-sectional view of the exemplary semiconductor structure of FIG. 1A along line B-B'.

Referring to FIGS. 1A and 1B, an exemplary semiconductor structure according to an embodiment of the present application includes a plurality of first semiconductor fins 20A formed in a first region of a substrate 10 and a plurality of second semiconductor fins 20B formed in a second region of the substrate 10. In one embodiment, the first region is a logic device region and the second region is a memory device region.

In one embodiment and as shown in FIG. 1B, the first and second semiconductor fins 20A, 20B can be formed by providing a bulk semiconductor substrate including a semiconductor material throughout, and by patterning an upper portion of the bulk semiconductor substrate. In this case, the remaining portion of the bulk semiconductor substrate underlying the first and second semiconductor fins 20A, 20B constitutes the substrate 10. The first and second semiconductor fins 20A, 20B are adjoined to the substrate 10 and are comprised of the same semiconductor material as the upper portion of the bulk semiconductor substrate.

The bulk semiconductor substrate may include a semiconductor material such as, for example, Si, Ge, SiGe, SiC, SiGeC or an III-V compound semiconductor. In one embodiment, the bulk semiconductor substrate includes a single crystalline semiconductor material such as, for example, single crystalline silicon. The thickness of the bulk semiconductor substrate can be from 30 µm to about 2 mm, although lesser and greater thicknesses can also be employed. The bulk semiconductor substrate may be doped with dopants of p-type or n-type. In one embodiment, the dopants may be a p-type dopant including, but not limited to, boron (B), aluminum (Al), gallium (Ga), and indium (In) for Si based substrate. In another embodiment, the dopants may be an n-type dopant including, but not limited to, antimony (Sb), arsenic (As), and phosphorous (P) for Si based substrate. The dopant concentration in the bulk semiconductor substrate can range from $1 \times 10^{14}$ atoms/cm$^3$ to $3 \times 10^{17}$ atoms/cm$^3$, although lesser and greater dopant concentrations can also be employed.

In one embodiment, the upper portion of the bulk semiconductor substrate can be patterned using lithography and etching to provide the first and second semiconductor fins 20A, 20B extending upwards from substrate 10. For example, a mask layer (not shown) can be applied over a top surface of the bulk semiconductor substrate and lithographically patterned to define a set of areas covered by a patterned mask layer. The mask layer can be a photoresist layer or a photoresist layer in conjunction with hardmask layer(s). The bulk semiconductor substrate is then etched by an anisotropic etch using the patterned mask layer as an etch mask. In one embodiment, a dry etch such as, for example, reactive ion etch (RIE) can be used. In another embodiment, a wet etch using a chemical etchant can be used. In still a further embodiment, a combination of dry etch and wet etch can be used. After formation of the first and second semiconductor fins 20A, 20B, the patterned mask layer can be removed, for example, by oxygen plasma. Other methods known in the art, such as sidewall image transfer (SIT) or directional self-assembly (DSA), can also be used to pattern the upper portion of the bulk semiconductor substrate to provide the first and second semiconductor fins 20A, 20B.

In another embodiment, the first and second semiconductor fins 20A, 20B can be formed by providing a semiconductor-on-insulator (SOI) substrate including a top semiconductor layer, a buried insulator layer, and a handle substrate, and by patterning the top semiconductor layer (not shown). In this case, the remaining portions of the top semiconductor layer after patterning constitute the first and second semiconductor fins 20A, 20B, and the buried insulator layer constitutes the substrate 10.

Subsequently, a shallow trench isolation (STI) layer 22 can be formed around lower portions of the semiconductor fins 20A, 20B; in some embodiments, the STI layer 22 can be omitted. As is shown, the height of the STI layer 22 is less than the height of each of the semiconductor fins 20A, 20B such that upper sidewalls and a topmost surface of each of the semiconductor fins 20A, 20B are exposed. The height of the portion of each of the semiconductor fins 20A, 20B located above the top surface of the STI layer 22 (or above the buried insulator layer if the semiconductor fins are formed from an SOI substrate) can be from 10 nm to 200 nm, although lesser and greater heights can also be employed.

The STI layer 22 can be formed by first depositing a trench dielectric material such as, a trench dielectric oxide, over and between the semiconductor fins 20A and 20B using a deposition process, such as, for example, chemical vapor deposition (CVD) or physical vapor deposition (PVD). In one embodiment, the trench dielectric oxide is silicon dioxide. The deposited trench dielectric material can then be planarized by a planarization technique such as, for example chemical mechanical planarization (CMP) followed by an etched back process to etch the deposited trench dielectric material to the desired thickness. An anisotropic etch such as, for example, RIE may be employed to remove the trench dielectric material of the STI layer 22 selective to the semiconductor material of the semiconductor fins 20A, 20B.

Figure 2A:
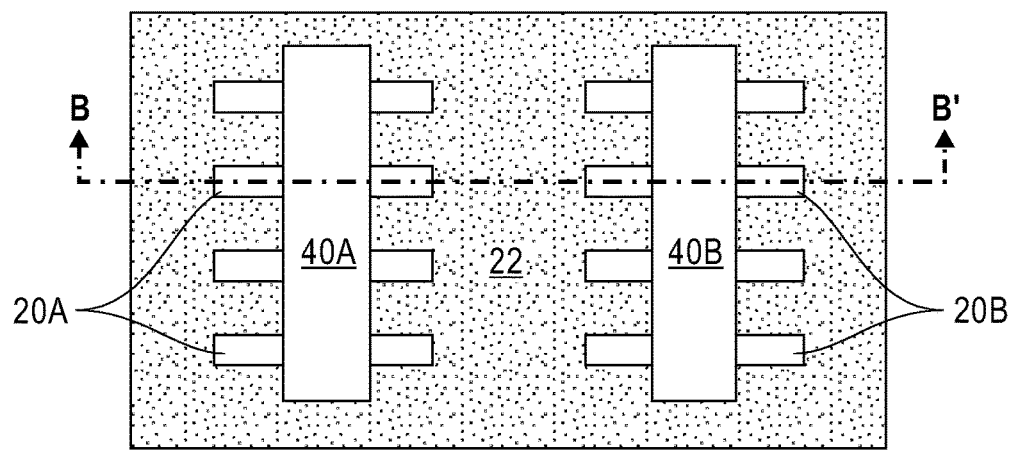
FIG. 2A is a top-down view of the exemplary semiconductor structure of FIGS. 1A and 1B after forming a first sacrificial gate stack straddling a portion of each first semiconductor fin and a second sacrificial gate stack straddling a portion of each second semiconductor fin.
Figure 2B:
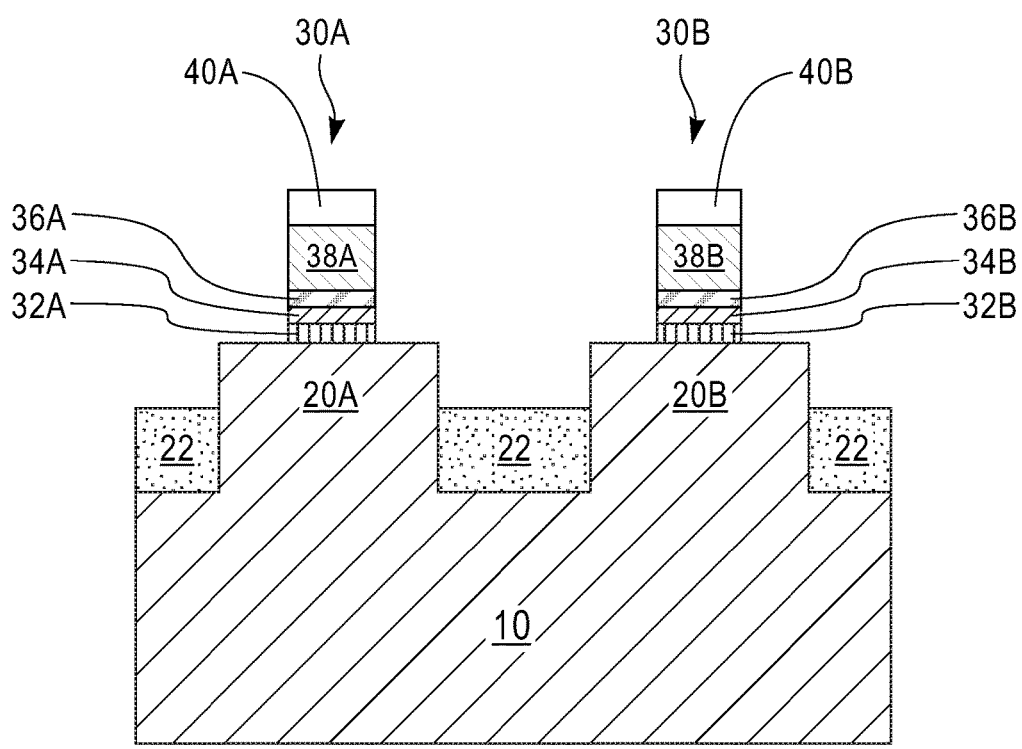
FIG. 2B is a cross-sectional view of the exemplary semiconductor structure of FIG. 2A along line B-B'.

Referring to FIGS. 2A and 2B, sacrificial gate stacks including a first sacrificial gate stack 30A formed over a portion of each of the first semiconductor fins 20A in the logic device region and a second sacrificial gate stack 30B formed over a portion of each of the second semiconductor fins 20B in the memory device region are provided. The term "sacrificial gate stack" as used herein refers to a placeholder structure for a functional gate stack to be subsequently formed. The term "functional gate stack" as used herein refers to a permanent gate stack used to control output current (i.e., flow of carriers in the channel) of a semiconducting device through electrical fields or magnetic fields. Although only one sacrificial gate stack is described and illustrated in each of the logic device region and the memory device region, the present application is not limited to such a number of sacrificial gate stacks. Instead, a plurality of sacrificial gate stacks can be formed in each of the logic device region and the memory device region.

The first sacrificial gate stack 30A straddles the first semiconductor fins 20A and includes, from bottom to top, a first tunneling oxide portion 32A, a first floating gate electrode 34A, a first control oxide portion 36A, a first gate conductor 38A and a first gate cap 40A. The second sacrificial gate stack 30B straddles the second semiconductor fins 20B and includes, from bottom to top, a second tunneling oxide portion 32B, a second floating gate electrode 34B, a second control oxide portion 36B, a second gate conductor 38B and a second gate cap 40B. By "straddle" it is meant that the sacrificial gate stack formed is in direct contact with a top surface and two vertical sidewalls of each semiconductor fin.

The sacrificial gate stacks 30A, 30B can be formed by first providing a material stack of a tunneling oxide layer, a floating gate electrode material layer, a control oxide layer, a gate conductor material layer and a gate cap material layer (not shown) over the first and second semiconductor fins 20A, 20B and the STI layer 22, and by subsequently patterning the material stack.

The tunneling oxide layer is deposited on the first and second semiconductor fins 20A, 20B and the STI layer 22. The tunneling oxide layer can include any dielectric oxide that can be employed as a tunneling gate dielectric material known in the art. For example, the tunneling oxide layer can include silicon dioxide. In one embodiment, the tunneling oxide layer can be formed by a deposition process such as, for example, CVD, plasma enhanced chemical vapor deposition (PECVD) or atomic layer deposition (ALD). In this case, the tunneling oxide layer is formed on the top surfaces and sidewalls of the first and second semiconductor fins 20A, 20B and on the top surface of the shallow trench dielectric layer 22. In another embodiment, the tunneling oxide layer can be formed by conversion of surface portions of the first and second semiconductor fins 20A, 20B into a dielectric material using thermal conversion or plasma conversion. In this case, the tunneling oxide layer is formed solely on the top surfaces and sidewalls of the first and second semiconductor fins 20A, 20B. The thickness of the tunneling oxide layer can be from 2 nm to 10 nm, although lesser and greater thicknesses can also be employed.

The floating gate electrode material layer is deposited on the tunneling oxide layer. The floating gate electrode material layer includes a doped semiconductor material. In one embodiment, the floating gate electrode material layer can include doped polysilicon, a doped silicon-germanium alloy, or a doped silicon-carbon alloy. The floating gate electrode material layer can be deposited, for example, by CVD, PVD or ALD. The thickness of the floating gate electrode material layer can be from 3 nm to 100 nm, although lesser and greater thicknesses can also be employed.

The control oxide layer is deposited on the floating gate electrode material layer. The control oxide layer can include any dielectric oxide that can be employed as a control gate dielectric as known in the art. For example, the control oxide layer can include silicon dioxide. The control oxide layer can be formed by deposition of a dielectric oxide using CVD or ALD, and/or by conversion of a surface portion of the floating gate electrode material layer using thermal conversion or plasma conversion. The thickness of the control oxide portion layer can be from 2 to 10 nm, although lesser and greater thicknesses can also be employed.

The gate conductor material layer is deposited on the control oxide layer. The gate conductor material layer may be composed of a semiconductor material such as, for example, silicon, germanium, a silicon germanium alloy, a silicon carbon alloy or a compound semiconductor material. In one embodiment, the gate conductor material layer is composed of polysilicon. The gate conductor material layer can be formed using CVD or PECVD. The thickness of the gate conductor material layer can be from 50 nm to 300 nm, although lesser and greater thicknesses can also be employed.

The gate cap material layer is deposited on the gate conductor material layer. The gate cap material layer can include a dielectric material such as, for example, silicon dioxide, silicon nitride or silicon oxynitride. The gate cap material layer can be formed by a deposition process including, for example, CVD, PECVD or PVD. The thickness of the gate cap material layer can be from 25 nm to 100 nm, although lesser or greater thicknesses can also be employed.

The material stack is patterned by lithography and etching. For example, a photoresist layer (not shown) may be applied over the hard mask layer and lithographically patterned. The pattern in the photoresist layer is sequentially transferred into the gate cap material layer, the gate conductor material layer, the control oxide layer, the floating gate electrode material layer and the tunneling oxide layer by at least one anisotropic etch. The anisotropic etch can be a dry etch such as, for example, RIE, a wet etch or a combination thereof. A remaining portion of the material stack overlying the first semiconductor fins 20A constitutes the first sacrificial gate stack 30A, and a remaining portion of the material stack overlying the second semiconductor fins 20B constitutes the second sacrificial gate stack 30B. The remaining photoresist layer may be subsequently removed by, for example, ashing.

Figure 3A:
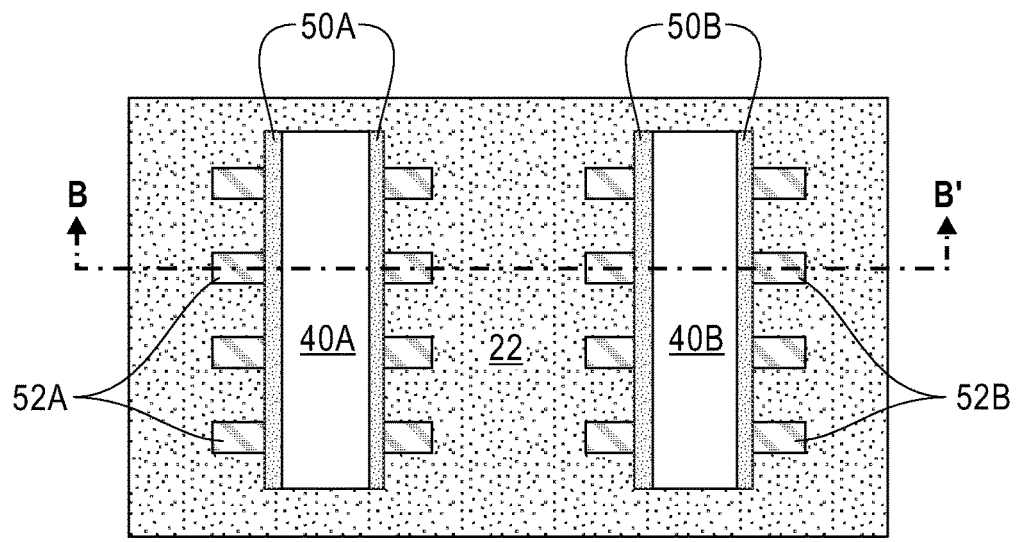
FIG. 3A is a top-down view of the exemplary semiconductor structure of FIGS. 2A and 2B after forming a first gate spacer on sidewalls of the first sacrificial gate stack and a second gate spacer on sidewalls of the second sacrificial gate stack and forming first source/drain regions in the first semiconductor fins and second source/drain regions in the second semiconductor fins.
Figure 3B:
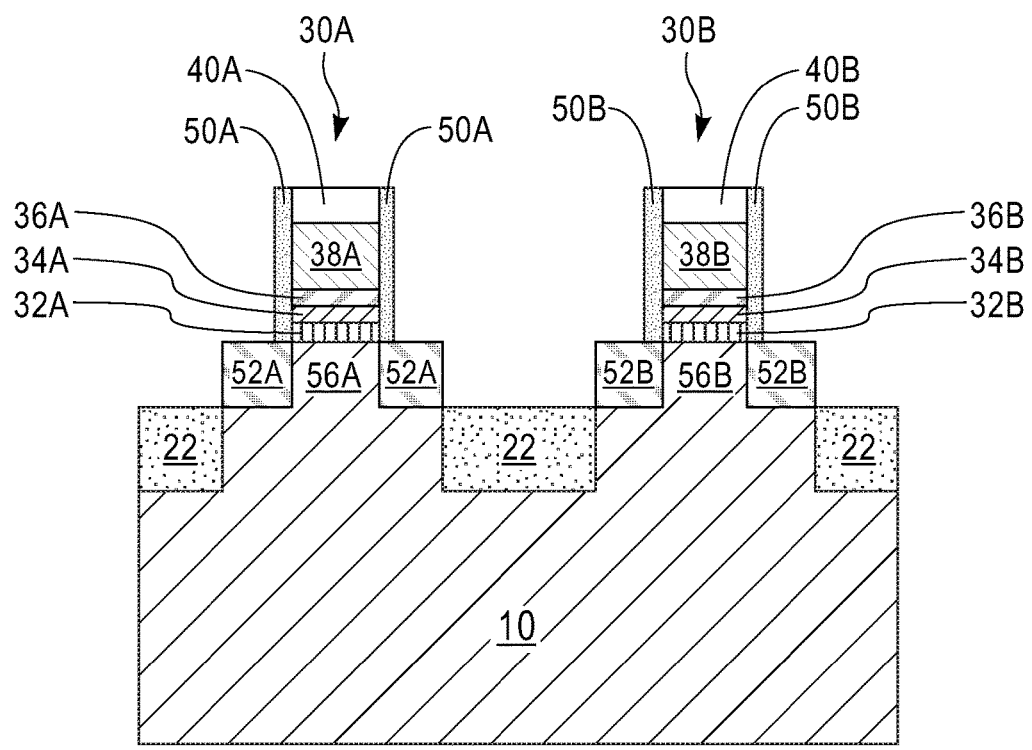
FIG. 3B is a cross-sectional view of the exemplary semiconductor structure of FIG. 3A along line B-B'.

Referring to FIGS. 3A and 3B, gate spacers including a first gate spacer 50A present on sidewalls of the first gate stack 30A and a second gate spacer 50B present on sidewalls of the second gate stack 30B are formed. The first and second gate spacers 50A, 50B may include a dielectric material such as, for example, an oxide, a nitride, an oxynitride, or any combination thereof. In one embodiment, each of the first and second gate spacers 50A, 50B is composed of silicon nitride. The first and second gate spacers 50A, 50B can be formed by first providing a conformal gate spacer material layer (not shown) on exposed surfaces of the first and second sacrificial gate stacks 50A, 50B, the first and second semiconductor fins 20A, 20B and the STI layer 22 and then etching the gate spacer material layer to remove horizontal portions of the gate spacer material layer. The gate spacer material layer can be provided by a deposition process including, for example, CVD, PECVD or ALD. The etching of the gate spacer material layer may be performed by a dry etch process such as, for example, RIE. A remaining vertical portion of the gate spacer material layer that is present on the sidewalls of the first gate stack 30A constitutes the first gate spacer 50A. A remaining vertical portion of the gate spacer material layer that is present on the sidewalls of the second gate stack 30B constitutes the second gate spacer 50B. The width of each of the gate spacers 50A, 50B, as measured at the base, can be from 5 nm to 100 nm, although lesser and greater widths can also be employed.

A first source region and a first drain region (collectively referred to as first source/drain regions 52A) are formed within regions of the first semiconductor fins 20A that do not underlie the first sacrificial gate stack 30A, and a second source region and a second drain region (collectively referred to as second source/drain regions 52B) are formed within regions of the second semiconductor fins 20B that do not underlie the second sacrificial gate stack 30B. In one embodiment, ion implantation of electrical dopants (i.e., p-type or n-type dopants) can be performed to provide the first source/drain regions 52A and the second source/drain regions 52B employing the first and second sacrificial gate stacks 30A, 30B as an implantation mask. The unplanted portion of each first semiconductor fin 20A is herein referred to as a first body region 56A. The unplanted portion of each second semiconductor fin 20B is herein referred to as a second body region 56B. Alternatively or additionally, the first and second source/drain regions 52A, 52B can be formed by selective deposition of a doped semiconductor material on the top surfaces and sidewalls of the first and second semiconductor fins 20A, 20B using selective epitaxy, followed by diffusing electrical dopants in the doped semiconductor material into the first and semiconductor fins 20A, 20B.

Figure 4A:
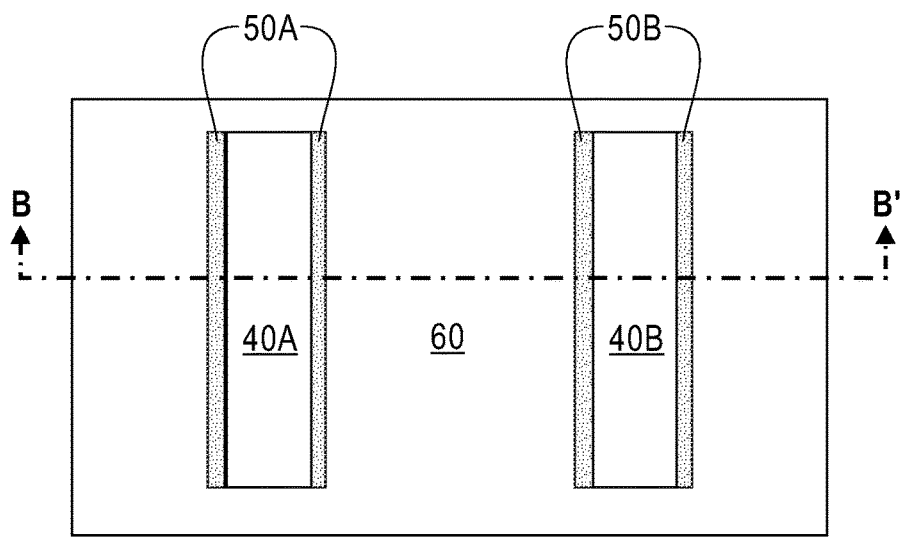
FIG. 4A is a top-down view of the exemplary semiconductor structure of FIGS. 3A and 3B after forming an interlevel dielectric (ILD) layer.
Figure 4B:
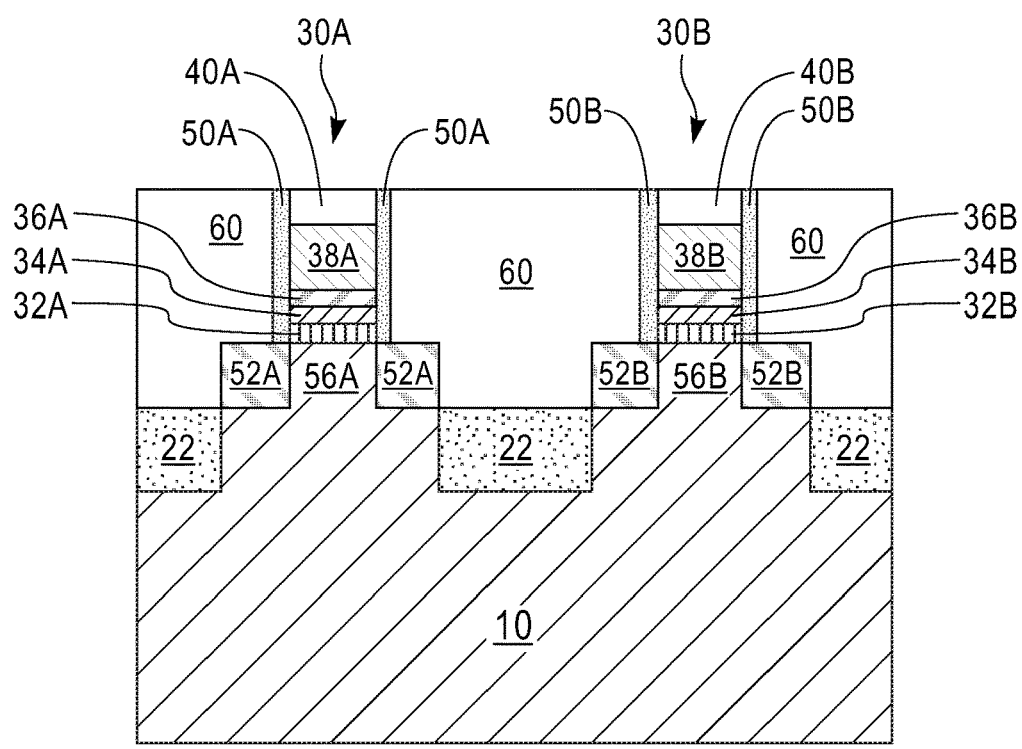
FIG. 4B is a cross-sectional view of the exemplary semiconductor structure of FIG. 4A along line B-B'.

Referring to FIGS. 4A and 4B, an interlevel dielectric (ILD) layer 60 is formed over the first and second source/drain regions 52A, 52B and the STI layer 22. The ILD layer 60 laterally surrounds the first and second sacrificial gate stacks 30A, 30B. The ILD layer 60 may include a dielectric material that may be easily planarized. For example, the ILD layer 60 can be a doped silicate glass, an undoped silicate glass (silicon oxide), an organosilicate glass (OSG), or a porous dielectric material. The ILD layer 60 can be formed by CVD, PVD or spin coating. The ILD layer 60 can be initially formed such that an entirety of the top surface of the ILD layer 60 is formed above the topmost surfaces of the first and second sacrificial gate stacks 30A, 30B (i.e., top surfaces of the first and second gate caps 40A, 40B). The ILD layer 60 can be subsequently planarized, for example, by CMP and/or a recess etch using the first and second gate caps 40A, 40B as a polishing and/or etch stop. After the planarization, the ILD layer 60 has a top surface coplanar with the top surfaces of the first and second gate caps 40A, 40B.

Figure 5A:
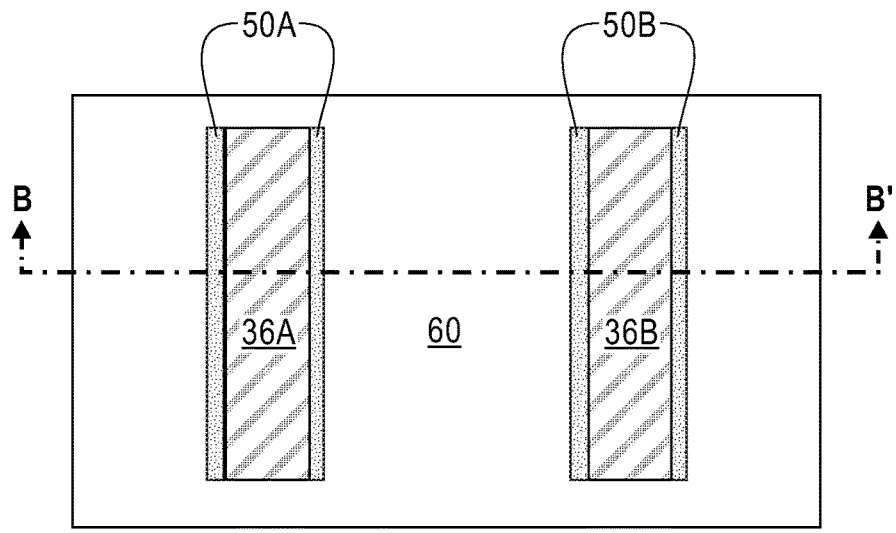
FIG. 5A is a top-down view of the exemplary semiconductor structure of FIGS. 4A and 4B after forming a first gate cavity by removing a first gate cap and a first gate conductor in the first sacrificial gate stack, and a second gate cavity by removing a second gate cap and a second gate conductor in the second sacrificial gate stack.
Figure 5B:
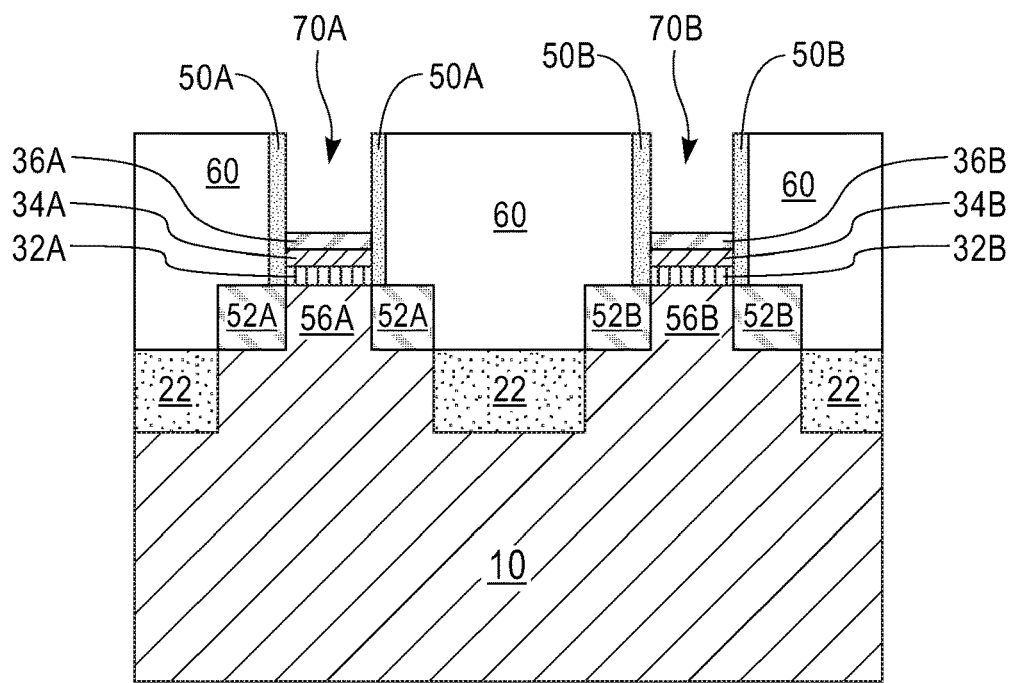
FIG. 5B is a cross-sectional view of the exemplary semiconductor structure of FIG. 5A along line B-B'.

Referring to FIGS. 5A and 5B, the first and second gate caps 40A, 40B and the first and second gate conductors 38A, 38B are removed by at least one etch. In one embodiment, a single etching process may be used to remove the first and second gate caps 40A, 40B and the first and second gate conductors 38A, 38B. In another embodiment, separate etching processes may be performed to remove theses layers. For example, a first etch can be performed to remove the first and second gate caps 40A, 40B. The first etch can be a dry etch and/or a wet etch that removes the dielectric material of the first and second gate caps 40A, 40B selective to the conductive material of the first and second gate conductors 38A, 38B as well as the dielectric materials of the first and second gate spacers 50A, 50B and the ILD layer 60. Subsequently, a second etch can be performed to remove the first and second gate conductors 38A, 38B. The second etch can be a dry etch and/or a wet etch that removes the conductive material of the first and second gate conductors 38A, 38B selective to the dielectric materials of the first and second control oxide portion s 36A, 36B, the first and second gate spacers 50A, 50B and the ILD layer 60. A first gate cavity 70A is thus formed in the logic device region, occupying a volume from which the stack of the first gate conductor 38A and the first gate cap 40A in the first sacrificial gate stack 30A is removed. Likewise, a second gate cavity 70B is formed in the memory device region, occupying a volume from which the stack of the second gate conductor 38B and the second gate cap 40B in the second sacrificial gate stack 30B is removed.

Figure 6A:
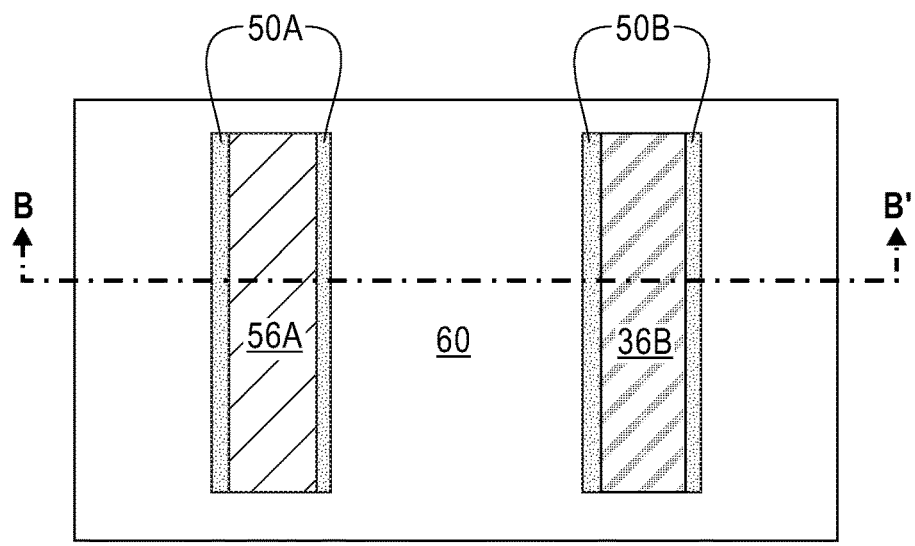
FIG. 6A is a top-down view of the exemplary semiconductor structure of FIGS. 5A and 5B after vertically extending the first gate cavity by removing remaining components of the first sacrificial gate stack including, from the bottom to top, a first tunneling oxide portion, a first floating gate electrode and a first control oxide portion from the logic device region, while remaining components of the second sacrificial gate stack including, from the bottom to top, a second tunneling oxide portion, a second floating gate electrode and a second control oxide portion remain in the memory device region.
Figure 6B:
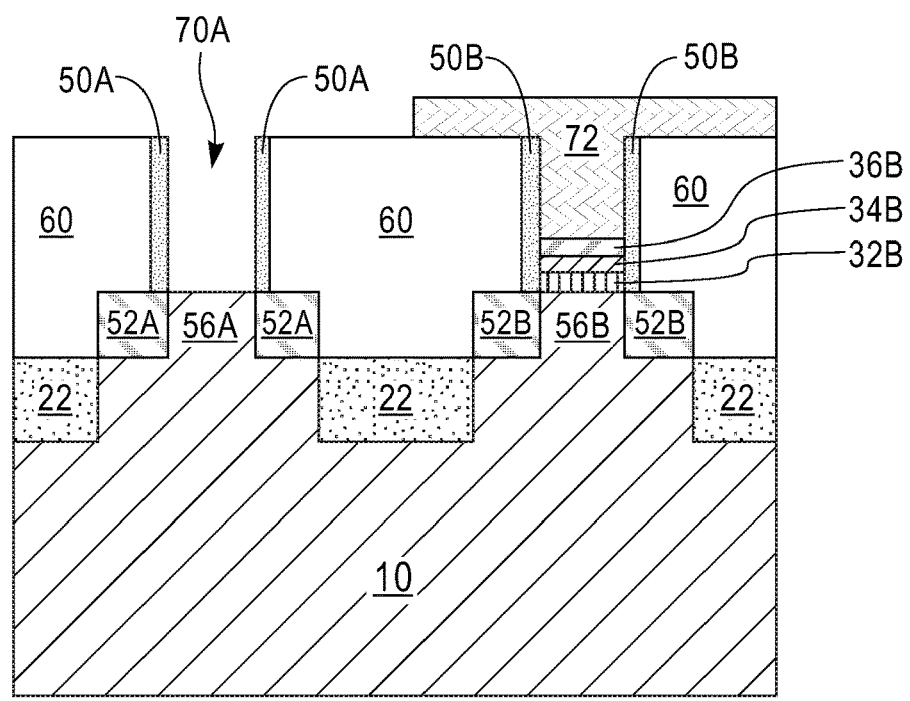
FIG. 6B is a cross-sectional view of the exemplary semiconductor structure of FIG. 6A along line B-B'.

Referring to FIGS. 6A and 6B, a mask layer (not shown) is applied over the ILD layer 60 and within the first and second gate cavities 70A, 70B and lithographically patterned such that a patterned mask layer 72 is present in the second gate cavity 70B covering the second control oxide portion 36B, but not in the first gate cavity 70A. The first control oxide portion 36A is thus exposed. The mask layer can be a photoresist layer or a photoresist layer in conjunction with hardmask layer(s).

The first control oxide portion 36A, the first floating gate electrode 34A and the first tunneling oxide portion 32A are removed from the first gate cavity 70A. In one embodiment, a single etching process may be used to remove the first control oxide portion 36A, the first floating gate electrode 34A and the first tunneling oxide portion 32A from the first gate cavity 70A. In another embodiment, separate etching processes may be performed to remove theses layers from the first gate cavity 70A. The etch chemistries are selected such that the etchants etch the first control oxide portion 36A, the first floating gate electrode 34A and the first tunneling oxide portion 32A, without affecting the first and second gate spacers 50A, 50B, the ILD layer 60 and the first semiconductor fins 20A. After etch, the first gate cavity 70A is vertically extended to expose the first body region 56A. The patterned mask layer 72 can then be removed, for example, by oxygen-based plasma etching.

Figure 7A:
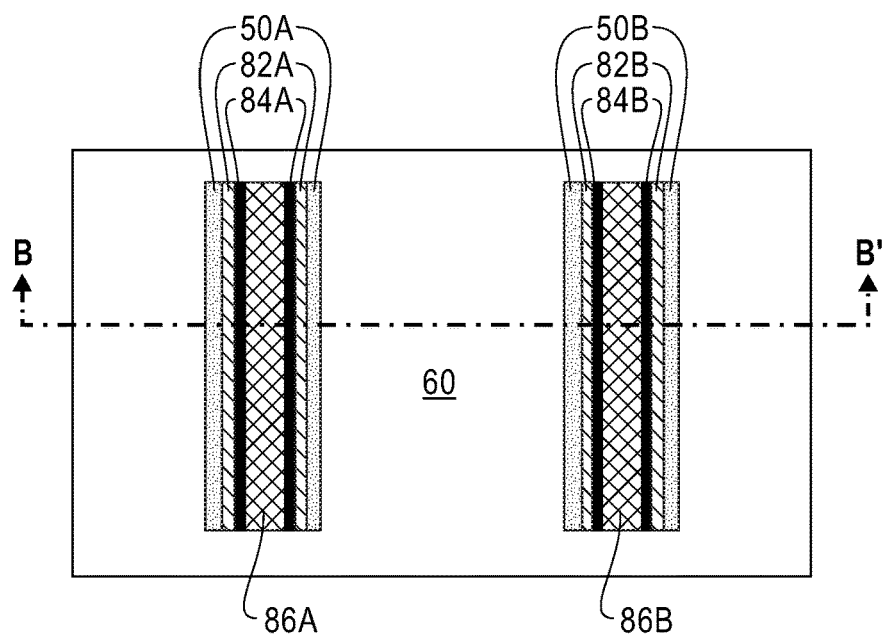
FIG. 7A is a top-down view of the exemplary semiconductor structure of FIGS. 6A and 6B after forming a first high-k gate dielectric and a first gate electrode in the vertically extended first gate cavity and a second high-k gate dielectric and a second gate electrode in the second gate cavity.
Figure 7B:
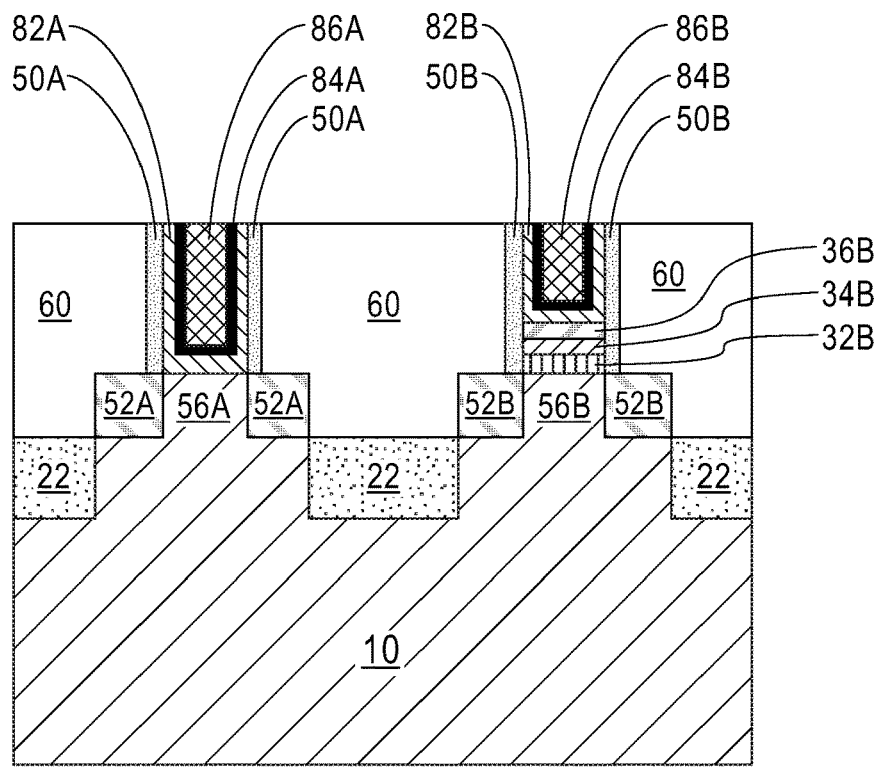
FIG. 7B is a cross-sectional view of the exemplary semiconductor structure of FIG. 7A along line B-B'.

Referring to FIGS. 7A-7B, a high dielectric constant (high-k) gate dielectric layer (not shown) is deposited on the bottom surfaces and sidewalls of the first and second gate cavities 70A, 70B, and on top surfaces of the first and second gate spacers 50A, 50B and the ILD layer 60. The high-k gate dielectric layer includes a dielectric material having a dielectric constant greater than 8.0. The high-k gate dielectric layer can include a dielectric metal oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The high-k gate dielectric layer can be formed by a deposition process, including but not limited to, CVD, PVD, ALD, molecular beam epitaxy (MBE), ion beam deposition, electron beam deposition, and laser assisted deposition. The thickness of the high-k gate dielectric layer can be from 1 nm to 10 nm, although lesser and greater thicknesses can also be employed.

A work function material layer (not shown) is deposited on the high-k gate dielectric layer. The work function material layer may include a metal having a work function suitable to optimize the performance of devices to be subsequently formed in the logic device region and the memory device region. In one embodiment, the work function material layer includes a silicon valence band edge metal such as, for example, Pt, Rh, Ir, Ru, Cu, Os, Be, Co, Pd, Te, Cr, Ni or TiN for p-type FETs. In another embodiment, the work function material layer includes a silicon conduction band edge metal such as Hf, Ti, Zr, Cd, La, Tl, Yb, Al, Ce, Eu, Li, Pb, Tb, Bi, In, Lu, Nb, Sm, V, Zr, Ga, Mg, Gd, Y or TiAl for n-type FETs. The work function material layer can be formed, for example, by CVD, PVD or ALD. The thickness of the work function material layer can be from 3 nm to 10 nm, although lesser and greater thicknesses can also be employed. The work functional material layer is optional and can be omitted in some embodiments of the present application.

A gate electrode material layer (not shown) is deposited on the high-k gate dielectric layer or the work functional material layer, if present, to fill remaining volumes of the first and the second gate cavities 70A, 70B. The gate electrode material layer may include a conductive metal including, for example, doped polysilicon, Al, Au, Ag, Cu or W. In one embodiment, the gate electrode material layer is comprised of W. The gate electrode material layer can be formed by a deposition process such as, for example, CVD, PVD and ALD. The thickness of the gate electrode material layer, as measured in a planar region of the gate electrode material layer above the top surface of the ILD layer 60, can be from 100 nm to 500 nm, although lesser and greater thicknesses can also be employed.

Subsequently, portions of the gate electrode material layer, the work function material layer, if present, and the high-k gate dielectric layer that are located above the top surface of the ILD layer 60 are removed by employing a planarization process, such as, for example, CMP. The remaining portion of the high-k gate dielectric layer within the first gate cavity 70A constitutes a first high-k gate dielectric 82A, and the remaining portion of the high-k gate dielectric layer within the second gate cavity 70B constitutes a second high-k gate dielectric 82B. The remaining portion of the work function material layer in the first gate cavity 70A constitutes a first work function material portion 84A, and the remaining portion of the work function material layer in the second gate cavity 70B constitutes a second work function material portion 84B. The remaining portion of the gate electrode material layer in the first gate cavity 70A constitutes a first gate electrode 86A, and the remaining portion of the gate electrode material layer in the second gate cavity 70B constitutes a second gate electrode 86B. The topmost surfaces of the first and second high-k gate dielectrics 82A, 82B, the first and second work function material portions 84A, 84B and the first and second gate electrodes 86A, 86B are coplanar with the top surface of the ILD layer 60.

A first functional gate stack (i.e., logic gate stack) is formed in the logic device region. As shown, the first functional gate stack includes, from bottom to top, a U-shaped first high-k gate dielectric 82B contacting the first body region 56A of each first semiconductor fin 20A, a first work function material portion 84A, and a first gate electrode 86A. The first functional gate stack is laterally surrounded by the first gate spacer 50A.

A second functional gate stack (i.e., memory gate stack) is formed in the memory device region. As shown, the second functional gate stack includes, from bottom to top, a tunnel oxide portion 32B contacting the second body region 56B of each second semiconductor fin 20B, a floating gate electrode 34B, a control oxide portion 36B, a U-shaped second high-k gate dielectric 82B, a second work function material portion 84B and a second gate electrode 86B. The second functional stack is laterally surrounded by the second gate spacer 50B. The control oxide portion 36B and the second high-k gate dielectric 82B together function as a control dielectric and the second gate electrode 86B functions as the control electrode for non-volatile transistors.

Thus, in the present application, logic transistors and non-volatile memory transistors are formed on the same substrate using a gate-last processing flow. Each logic transistor includes a first functional gate stack (82A, 84A, 86A) straddling a first body region 56A of a first semiconductor fin 20A, and first source/drain regions 52A within regions of the first semiconductor fin 20A that laterally surround the first body region 56A. The non-volatile memory transistor includes a second functional gate stack (32B, 36B, 38B, 82B, 84B, 86B) straddling a second body region 56B of a second semiconductor fin 20B, and second source/drain regions 52B within regions of the second semiconductor fin 20B that laterally surround the second body region 56B. Although a specific stack are shown for the non-volatile memory transistor, other stack can also be employed with same methods.

Figure 8A:
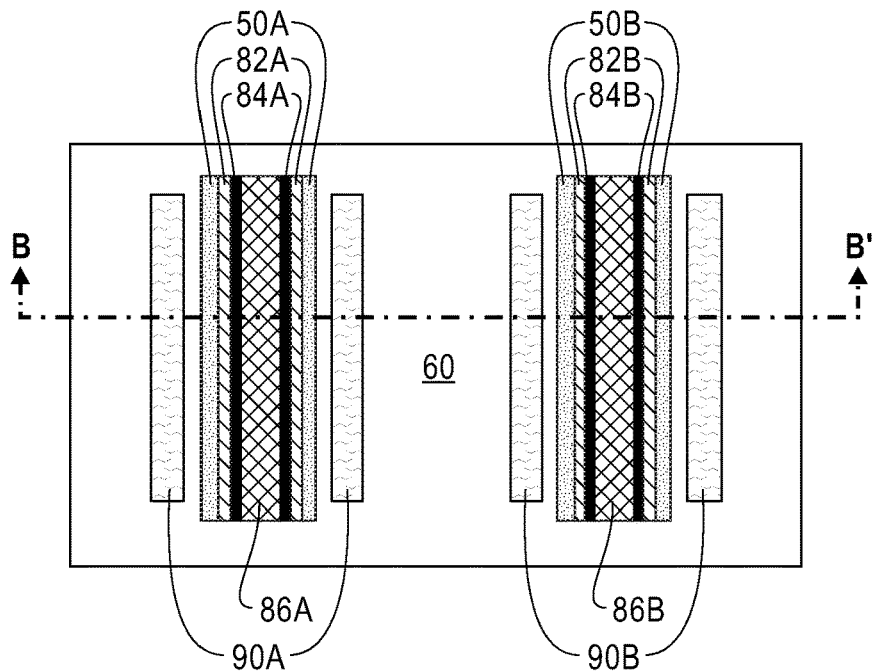
FIG. 8A is a top-down view of the exemplary semiconductor structure of FIGS. 7A and 7B after forming first source/drain contact structures contacting the first source/drain regions and second source/drain contact structures contacting the second source/drain regions.
Figure 8B:
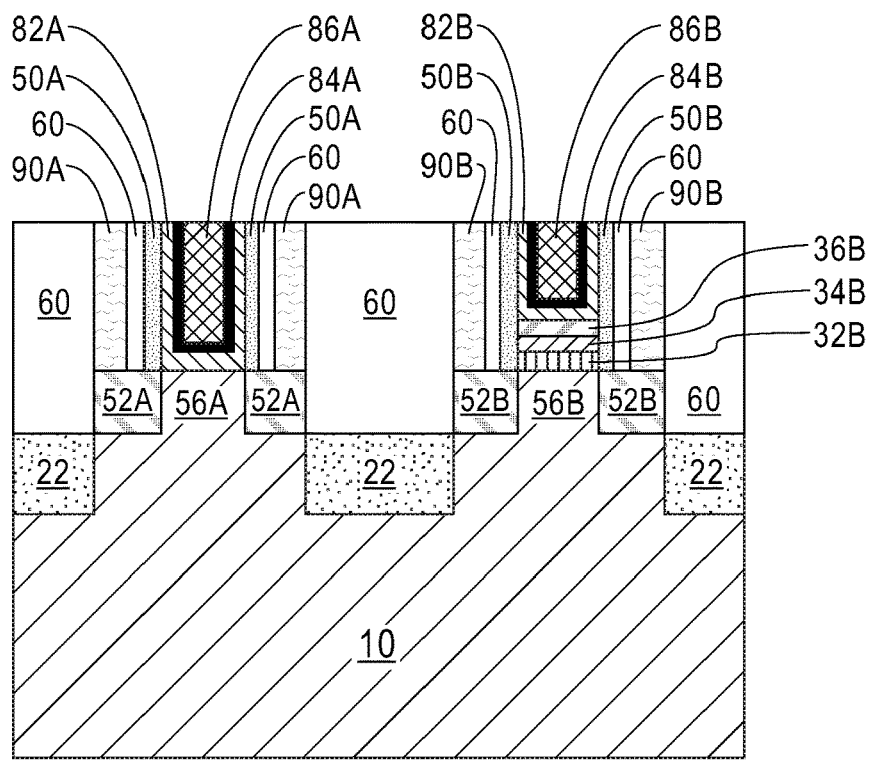
FIG. 8B is a cross-sectional view of the exemplary semiconductor structure of FIG. 8A along line B-B'.

Referring to FIGS. 8A and 8B, source/drain contact structures are formed. The source/drain contact structures include first source/drain contact structures 90A extending through the ILD layer 60 to form contact with the first source/drain regions 52A for logic transistors, and second source/drain contact structures 90B extending through the ILD layer 60 to form contact with the second source/drain regions 52B for non-volatile memory transistors.

The first and second source/drain contact structures 90A, 90B can be formed by formation of contact openings (not shown) within the ILD layer 60 utilizing a combination of lithographic patterning and anisotropic etch followed by deposition of a conductive metal (e.g., copper) and planarization that removes an excess portions of the conductive metal from above the top surface of the ILD layer 60. Optionally, contact liners (not shown) may be formed on the sidewalls and bottoms surfaces of the contact openings before filling the contact openings with the conductive metal. The contact liners may include TiN.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A semiconductor structure comprising:
   a logic transistor located in a logic device region of a substrate, the logic transistor comprising:
      a first functional gate stack contacting a first body region of a first semiconductor fin and including a first high-k gate dielectric and a first gate electrode surrounded by the first high-k gate dielectric, and
      first source/drain regions located within the first semiconductor fin and laterally surrounding the first body region;
   a non-volatile memory transistor located in a memory device region of the substrate, the non-volatile memory transistor comprising:
      a second functional gate stack contacting a second body region of a second semiconductor fin and including a tunnel oxide portion, a floating gate electrode, a control oxide portion, a second high-k gate dielectric and a second gate electrode surrounded by the second high-k gate dielectric, and second source/drain regions located within the second semiconductor fin and laterally surrounding the second body region;

an interlevel dielectric (ILD) layer laterally surrounding the first functional gate stack and the second functional gate stack;

a first source/drain contact structure contacting a topmost surface of each of the first source/drain regions and embedded in the ILD layer; and a second source/drain contact structure contacting a topmost surface of each of the second source/drain regions and embedded in the ILD layer, wherein each of the first source/drain contact structure and the second source/drain contact structure has a topmost surface that is coplanar with a topmost surface of the ILD layer and coplanar with a topmost surface of each of the first high-k gate dielectric, the first gate electrode, the second high-k gate dielectric and the second gate electrode.

2. The semiconductor structure of claim 1, wherein each of the first high-k gate dielectric and the second high-k gate dielectric is a U-shaped gate dielectric.

3. The semiconductor structure of claim 1, wherein the first functional gate stack further comprises a first work function material portion located between the first high-k gate dielectric and the first gate electrode, and the second functional gate stack further comprises a second work function material portion located between the second high-k gate dielectric and the second gate electrode.

4. The semiconductor structure of claim 1, wherein each of the tunneling oxide portion and the control oxide portion comprises silicon dioxide, and the floating gate electrode comprises polysilicon.

5. The semiconductor structure of claim 1, further comprising a shallow trench isolation layer located on the substrate and between the first semiconductor fin and the second semiconductor fin, wherein the shallow trench isolation layer has a height that is less than a height of the first and second semiconductor fins.

6. The semiconductor structure of claim 1, wherein the substrate comprises a semiconductor material.

7. The semiconductor structure of claim 1, wherein the substrate has an upper portion that is composed of an insulator layer, and wherein the first and second semiconductor fins are located directly on the insulator layer.

8. The semiconductor structure of claim 1, wherein the topmost surface of each of first high-k gate dielectric, the first gate electrode, the second high-k gate dielectric and the second gate electrode are coplanar with each other.

9. The semiconductor structure of claim 1, wherein a bottommost surface of the first high-k gate dielectric is in direct contact with the first body region of the first semiconductor fin, and wherein a bottommost surface of the second high-k gate dielectric is direct contact with the control oxide portion.

10. The semiconductor structure of claim 1, further comprising a first gate spacer located on sidewalls of the first functional gate stack and having a bottommost surface located on a topmost surface of the first source/drain regions, and a second gate spacer located on sidewalls of the second functional gate stack and having a bottommost surface located on a topmost surface of the second source/drain regions.

11. The semiconductor structure of claim 1, wherein the tunnel oxide portion, the floating gate electrode and the control oxide portion have outermost surfaces that are vertically aligned to outermost sidewalls of the second high-k gate dielectric.

12. The semiconductor structure of claim 1, wherein the logic transistor further comprises a first gate spacer located on sidewalls of the first functional gate stack, wherein vertical portions of the first high-k gate dielectric are in contact with the first gate spacer.

13. The semiconductor structure of claim 1, wherein the non-volatile memory transistor further comprises a second gate spacer located on sidewalls of the second functional gate stack, wherein sidewalls of the tunneling oxide portion, the floating gate electrode and the control oxide portion are in contact with lower portions of the second gate spacer, and vertical portions of the second high-k gate dielectric are in contact with upper portions of the second gate spacer.

14. A semiconductor structure comprising:

a logic transistor located in a logic device region of a substrate, the logic transistor comprising:

a first functional gate stack contacting a first body region of a first semiconductor fin and including a U-shaped first high-k gate dielectric and a first gate electrode surrounded by the U-shaped first high-k gate dielectric, and first source/drain regions located within the first semiconductor fin and laterally surrounding the first body region;

a non-volatile memory transistor located in a memory device region of the substrate, the non-volatile memory transistor comprising:

a second functional gate stack contacting a second body region of a second semiconductor fin and including a tunnel oxide portion, a floating gate electrode, a control oxide portion, a second U-shaped high-k gate dielectric and a second gate electrode surrounded by the second U-shaped high-k gate dielectric, wherein the tunnel oxide portion, the floating gate electrode and the control oxide portion have outermost surfaces that are vertically aligned to outermost sidewalls of the second U-shaped high-k gate dielectric, and second source/drain regions located within the second semiconductor fin and laterally surrounding the second body region;

an interlevel dielectric (ILD) layer laterally surrounding the first functional gate stack and the second functional gate stack;

a first source/drain contact structure contacting a topmost surface of each of the first source/drain regions and embedded in the ILD layer; and a second source/drain contact structure contacting a topmost surface of each of the second source/drain regions and embedded in the ILD layer, wherein each of the first source/drain contact structure and the second source/drain contact structure has a topmost surface that is coplanar with a topmost surface of the ILD layer and coplanar with a topmost surface of each of the first U-shaped high-k gate dielectric, the first gate electrode, the second U-shaped high-k gate dielectric and the second Rate electrode.

15. The semiconductor structure of claim 14, wherein the logic transistor further comprises a first gate spacer located on sidewalls of the first functional gate stack, wherein vertical portions of the first U-shaped high-k gate dielectric are in contact with the first gate spacer.

16. The semiconductor structure of claim 14, wherein the non-volatile memory transistor further comprises a second gate spacer located on sidewalls of the second functional gate stack, wherein sidewalls of the tunneling oxide portion, the floating gate electrode and the control oxide portion are in contact with lower portions of the second gate spacer, and vertical portions of the second U-shaped high-k gate dielectric are in contact with upper portions of the second gate spacer.

\* \* \* \* \*